(12) United States Patent
Wang et al.

(10) Patent No.: US 10,163,728 B2
(45) Date of Patent: Dec. 25, 2018

(54) SEMICONDUCTOR DEVICE HAVING A STACKED FIN STRUCTURE AND MANUFACTURING METHOD THEREOF

(71) Applicant: TAIWAN SEMICONDUCTOR MANUFACTURING CO., LTD., Hsinchu (TW)

(72) Inventors: Sheng-Chen Wang, Hsinchu (TW); Kai-Hsuan Lee, Hsinchu (TW); Sai-Hooi Yeong, Zhubei (TW); Chia-Ta Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/242,155

(22) Filed: Aug. 19, 2016

(65) Prior Publication Data

US 2017/0125304 A1    May 4, 2017

Related U.S. Application Data

(63) Continuation of application No. 14/927,190, filed on Oct. 29, 2015, now Pat. No. 9,449,882.

(51) Int. Cl.
*H01L 21/8238* (2006.01)
*H01L 21/8234* (2006.01)
(Continued)

(52) U.S. Cl.
CPC .. *H01L 21/823821* (2013.01); *H01L 21/0217* (2013.01); *H01L 21/02271* (2013.01);
(Continued)

(58) Field of Classification Search
CPC .............. H01L 29/165; H01L 29/1054; H01L 29/0924; H01L 21/845; H01L 21/76264;
(Continued)

(56) References Cited

U.S. PATENT DOCUMENTS

| 8,367,498 B2 | 2/2013 | Chang et al. |
| 9,449,882 B1 * | 9/2016 | Wang ............. H01L 21/823431 |

(Continued)

FOREIGN PATENT DOCUMENTS

| KR | 20050017584 A | 2/2005 |
| KR | 20130007412 A | 1/2013 |

OTHER PUBLICATIONS

Notice of Allowance U.S. Appl. No. 14/927,190 dated May 20, 2016.

(Continued)

*Primary Examiner* — Stephen Bradley
(74) *Attorney, Agent, or Firm* — McDermott Will & Emery LLP

(57) ABSTRACT

In manufacturing a semiconductor device, a stack of first and second semiconductor layers are formed. A fin structure is formed by patterning the first and second semiconductor layers. A cover layer is formed on a bottom part of the fin structure so as to cover side walls of the bottom portion of the fin structure and a bottom part of side walls of the upper portion of the fin structure. An insulating layer is formed so that the fin structure is embedded in the insulating layer. A part of the upper portion is removed so that an opening is formed in the insulating layer. A third semiconductor layer is formed in the opening on the remaining layer of the second semiconductor layer. The insulating layer is recessed so that a part of the third semiconductor layer is exposed from the insulating layer, and a gate structure is formed.

20 Claims, 12 Drawing Sheets

(51) Int. Cl.
*H01L 29/66* (2006.01)
*H01L 27/088* (2006.01)
*H01L 29/165* (2006.01)
*H01L 29/78* (2006.01)
*H01L 27/092* (2006.01)
*H01L 29/10* (2006.01)
*H01L 21/02* (2006.01)
*H01L 21/762* (2006.01)

(52) U.S. Cl.
CPC ............... *H01L 21/76224* (2013.01); *H01L 21/823412* (2013.01); *H01L 21/823431* (2013.01); *H01L 21/823807* (2013.01); *H01L 21/823878* (2013.01); *H01L 27/0886* (2013.01); *H01L 27/0924* (2013.01); *H01L 29/1054* (2013.01); *H01L 29/1083* (2013.01); *H01L 29/165* (2013.01); *H01L 29/66795* (2013.01); *H01L 29/785* (2013.01); *H01L 29/7848* (2013.01)

(58) Field of Classification Search
CPC ..... H01L 21/823807; H01L 21/823821; H01L 21/823878; H01L 29/785–29/7586; H01L 2029/7857–2029/7858
See application file for complete search history.

(56) References Cited

U.S. PATENT DOCUMENTS

| | | | |
|---|---|---|---|
| 2005/0035391 | A1 | 2/2005 | Lee et al. |
| 2009/0045467 | A1* | 2/2009 | Kakoschke ......... H01L 21/8249 257/370 |
| 2012/0104472 | A1 | 5/2012 | Xu et al. |
| 2012/0319211 | A1 | 12/2012 | van Dal et al. |
| 2013/0001591 | A1 | 1/2013 | Wu et al. |
| 2014/0054547 | A1* | 2/2014 | Eneman ................ H01L 29/785 257/24 |
| 2015/0263097 | A1* | 9/2015 | Cheng .................. H01L 29/165 257/192 |
| 2015/0311341 | A1* | 10/2015 | Hur .................. H01L 21/02532 257/190 |
| 2016/0254195 | A1* | 9/2016 | Jacob .............. H01L 21/823821 438/221 |

OTHER PUBLICATIONS

Office Action for Korean Patent Application No. 10-2016-0135693, dated Oct. 11, 2017.
Office Action dated Jul. 25, 2017 issued in Taiwanese Patent Application No. 105124581.

* cited by examiner

US 10,163,728 B2

SEMICONDUCTOR DEVICE HAVING A STACKED FIN STRUCTURE AND MANUFACTURING METHOD THEREOF

CROSS-REFERENCE TO RELATED APPLICATIONS

This Application is a Continuation Application of U.S. Ser. No. 14/927,190 filed Oct. 29, 2015, the subject matter of which is incorporated herein by reference in entirety.

TECHNICAL FIELD

The disclosure relates to a semiconductor integrated circuit, and more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices.

In some devices, germanium or silicon germanium (SiGe) may be used as a channel region to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-10 are exemplary cross sectional views illustrating a sequential process for manufacturing a semiconductor FET device according to one embodiment of the present disclosure. It is understood that additional operations can be provided before, during, and after operations shown by FIGS. 1-10, and some of the operations described below can be replaced or eliminated, for additional embodiments of the method. The order of the operations may be interchangeable.

Figure 1:
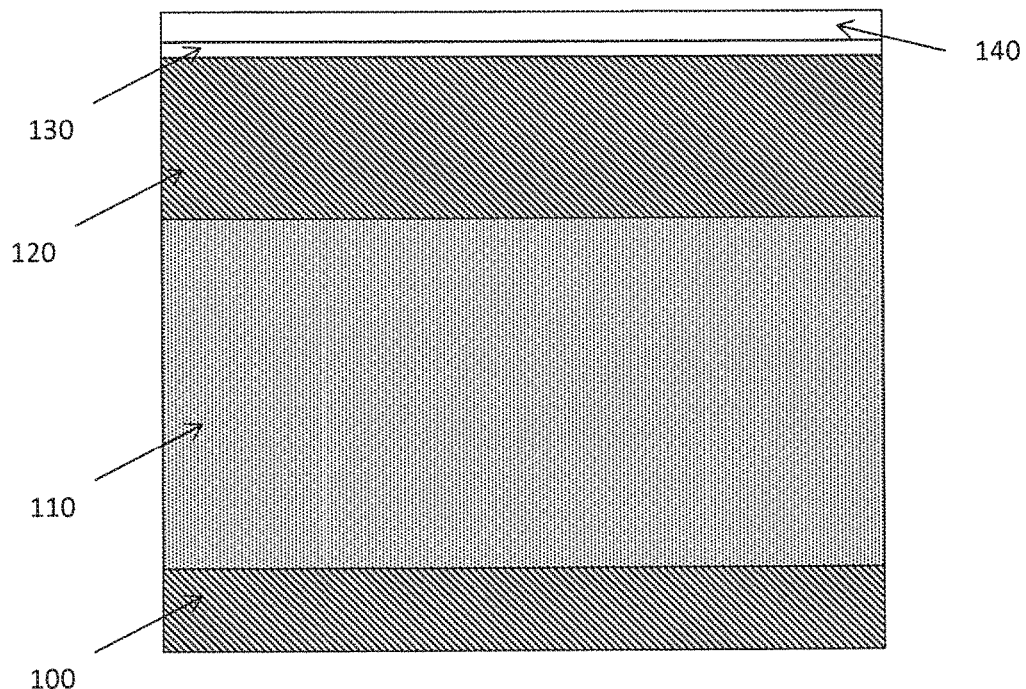
FIGS. 1-12 are exemplary cross sectional views illustrating a sequential process for manufacturing a semiconductor FET device according to one embodiment of the present disclosure.

In FIG. 1, a substrate 100 is provided and a first semiconductor layer 110 is formed over the substrate 100. Further, second semiconductor layer 120 is formed over the first semiconductor layer.

The substrate 100 is, for example, a p-type silicon substrate with an impurity concentration in a range of about $1 \times 10^{15}$ cm$^{-3}$ and about $1 \times 10^{16}$ cm$^{-3}$. In other embodiments, The substrate 100 is an n-type silicon substrate with an impurity concentration in a range of about $1 \times 10^{15}$ cm$^{-3}$ and about $1 \times 10^{16}$ cm$^{-3}$. Alternatively, the substrate 100 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 100 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. The substrate 100 may include various regions that have been suitably doped with impurities (e.g., p-type or n-type conductivity). The dopants are, for example boron (BF$_2$), phosphorus and/or arsenic. In this embodiment, the substrate is a silicon substrate (wafer).

As shown in FIG. 1, a first semiconductor layer 110 is epitaxially grown over the surface of the substrate 100, and a second semiconductor layer 120 is epitaxially grown over the first semiconductor layer 110. Further, a mask layer including a first layer 130 and a second layer 140 is formed over the second semiconductor layer 120.

The first semiconductor layer 110 is, for example $Si_{(1-x)}Ge_x$, where x is in a range of about 0.1 to about 0.5. In some embodiments, x in $Si_{(1-x)}Ge_x$ may be in a range of about 0.2 to about 0.4. In the present disclosure, $Si_{1-x}Ge_x$ may be simply referred to as SiGe. The thickness of the SiGe first semiconductor layer 110 is in a range of about 0.5 μm to about 2 μm in some embodiments. By growing a relatively thick SiGe layer 110 over the Si substrate 100, the stress induced in the SiGe layer 110 can be reduced and relaxed. In some embodiments, the thickness of the SiGe first semiconductor layer 110 is in a range of about 1 μm to about 1.5 μm. In certain embodiments, a Ge layer or a $Si_{(1-x)}Ge_x$, where x is less than about 0.1, may be used as the first semiconductor layer 110. In other embodiments, III-V compound semiconductors such as GaAs, GaP, GaN, InP, InAs, InSb, GaAsP, AlGaN, AlInAs, AlGaAs, GaInAs, GaInP, and/or GaInAsP may be used as the first semiconductor layer 110.

The first semiconductor layer 110 may be doped or may not be doped. The doping may be performed during the epitaxial growth of the first semiconductor layer 110 or may be performed by ion implantation.

The second semiconductor layer 120 is, for example Si or $Si_{(1-y)}Ge_y$, where y is less than about 0.1. In this embodiment, the second semiconductor layer is epitaxially grown Si. The second semiconductor layer 120 has a thickness in a range of about 30 nm to about 200 nm in some embodiments. In certain embodiments, the thickness of the second semiconductor layer 120 is in a range of about 50 nm to about 150 nm.

The mask layer may include, for example, a pad oxide (e.g., silicon oxide) layer 130 and a silicon nitride (SiN) mask layer 140 in some embodiments. The thickness of the pad oxide layer is in a range of about 2 nm to about 15 nm and the thickness of the silicon nitride mask layer is in a range of about 10 nm to about 50 nm in some embodiments.

Figure 2:
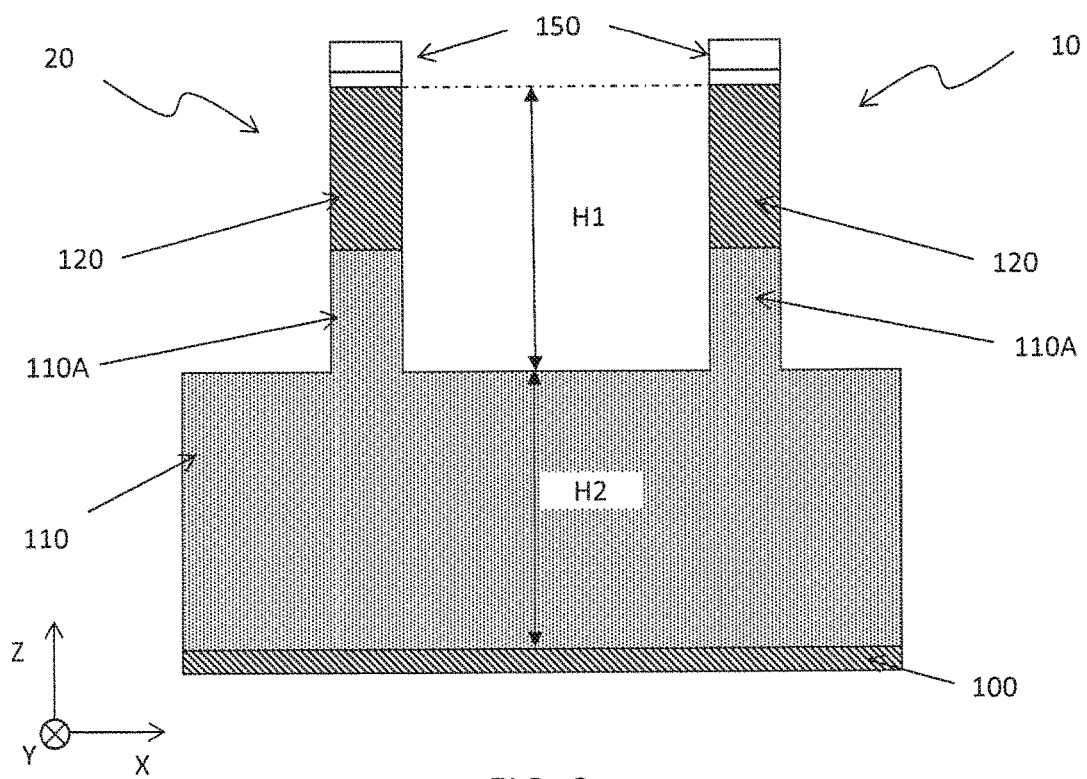

As shown in FIG. 2, the stacked layers of the first and second semiconductor layers are patterned into fin structures.

By using patterning operations including lithography and etching, the mask layer is patterned into mask patterns 150. The width of each of the patterns 150 is in a range of about 5 nm to about 40 nm in some embodiments, or may be in a range of about 10 nm to about 30 nm in other embodiments. By using the mask patterns 150 as etching masks, the first and second semiconductor layers are pattered into fin structures 10 and 20 by trench etching using a dry etching method and/or a wet etching method. As shown in FIG. 2, the trench etching is performed through the second semiconductor layer 120 and to the middle of the first semiconductor layer 110. The bottom portion of the fin structures 110A are made of the first semiconductor layer, and the upper portion of the fin structures 120 are made of the second semiconductor layer.

In this embodiment, the fin structure 10 is for a p-type Fin FET and the fin structure 20 is for an n-type Fin FET. Although in FIG. 2, the fin structures 10 and 20 are disposed adjacent to each other, the fin structure 10 for a p-type Fin FET may be disposed apart from the fin structure 20 for an n-type Fin FET. Further, the number of the fin structures is not limited to one (or two). The numbers may be two or more. In addition, one or more dummy fin structures may be disposed adjacent to both sides of the fin structure 10 and/or the fin structure 20 to improve pattern fidelity in patterning processes. The fin structures 10 and 20 extend in the Y direction and arranged in the X direction crossing the Y direction.

The width of the fin structures 10 and 20 is in a range of about 5 nm to about 40 nm in some embodiments, and may be in a range of about 7 nm to about 15 nm in certain embodiments. The height H1 of the fin structures 10 and 20 is in a range of about 50 nm to about 300 nm in some embodiments, and may be in a range of about 100 nm to 200 nm in other embodiments. The space between adjacent fin structures is in a range of about 5 nm to about 80 nm in some embodiments, and may be in a range of about 7 nm to 15 nm in other embodiments. The remaining thickness H2 of the first semiconductor layer 110 is in a range of about 500 μm to about 800 μm. When the heights of the fin structures are not uniform, the height H1 from the bottoms of the fin structure may be measured from the plane that corresponds to the average levels of the bottoms of the fin structures. Similarly, H2 can be measured from the upper surface of the substrate 100 to the plane.

Further, although in FIG. 2, the fin structures 10 and 20 have substantially vertical side walls, the fin structures 10 and 20 may have a tapered shape, in which the top width is smaller than the bottom width, in some embodiments. If the width of the fin structures 10 and 20 is not uniform from the top to the bottom, the width may be defined as an average width, a width at the vertical midpoint or a width at the interface between the first and second semiconductor layers. One skilled in the art will realize, however, that the dimensions and values recited throughout the descriptions are merely examples, and may be changed to suit different scales of integrated circuits.

Figure 3:
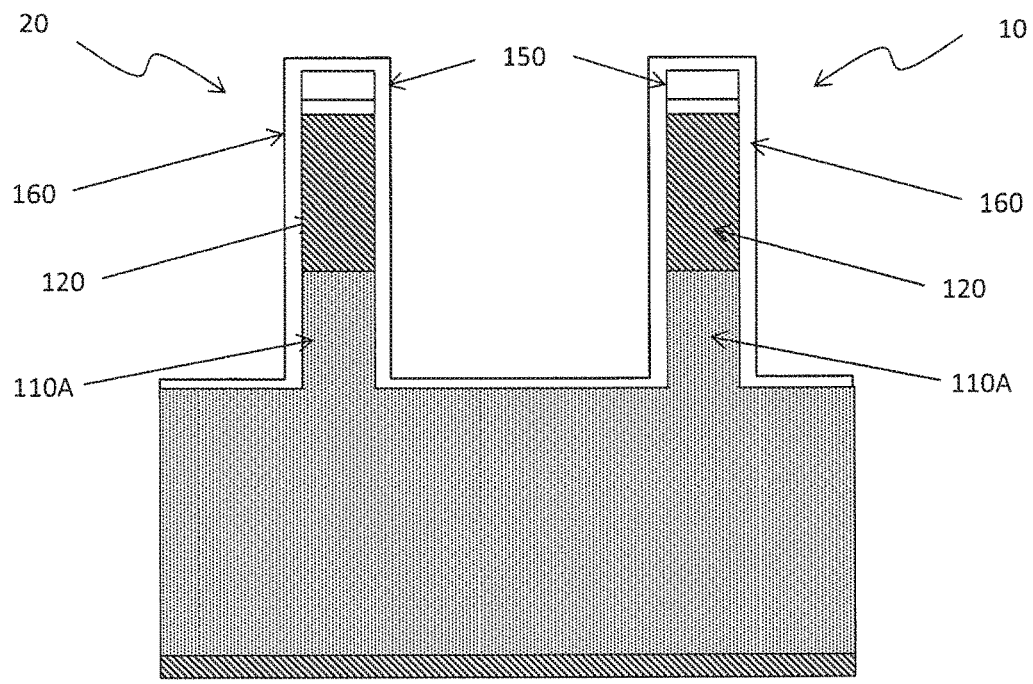

After forming the fin structures, a protective (cover) layer 160 is formed to cover the fin structures 10 and 20, as shown in FIG. 3. The protective layer 160 is made of a material that prevents an underlying layer (the first semiconductor layer) from being oxidized. In some embodiments, the protective layer 160 is made of one or more layers of silicon nitride (SiN), SiC, SiOCN and SiCN. The thickness of the protective layer 160 is in a range of about 1 nm to about 10 nm in some embodiments. In certain embodiments, the thickness of the protective layers 160 is in a range of about 2 nm to about 5 nm in some embodiments. In this embodiment, SiN is used as the protective layers 160.

The protective layer 160 is formed by chemical vapor deposition CVD, plasma-enhanced chemical vapor deposition (PECVD), atmospheric pressure chemical vapor deposition (APCVD), low-pressure CVD (LPCVD), high density plasma CVD (HDPCVD) and/or atomic layer deposition (ALD), and/or other suitable processes.

During the film formation process, the substrate temperature is in a range of 300° C. to 500° C. In some embodiments, the substrate temperature may be in a range of 350° C. to 450° C. By maintaining the substrate temperature relatively lower than typical CVD processes during the film formation process, it is possible to suppress diffusion of germanium in the first semiconductor layer into the second semiconductor layer. In some embodiments, PECVD is utilized.

Figure 4:
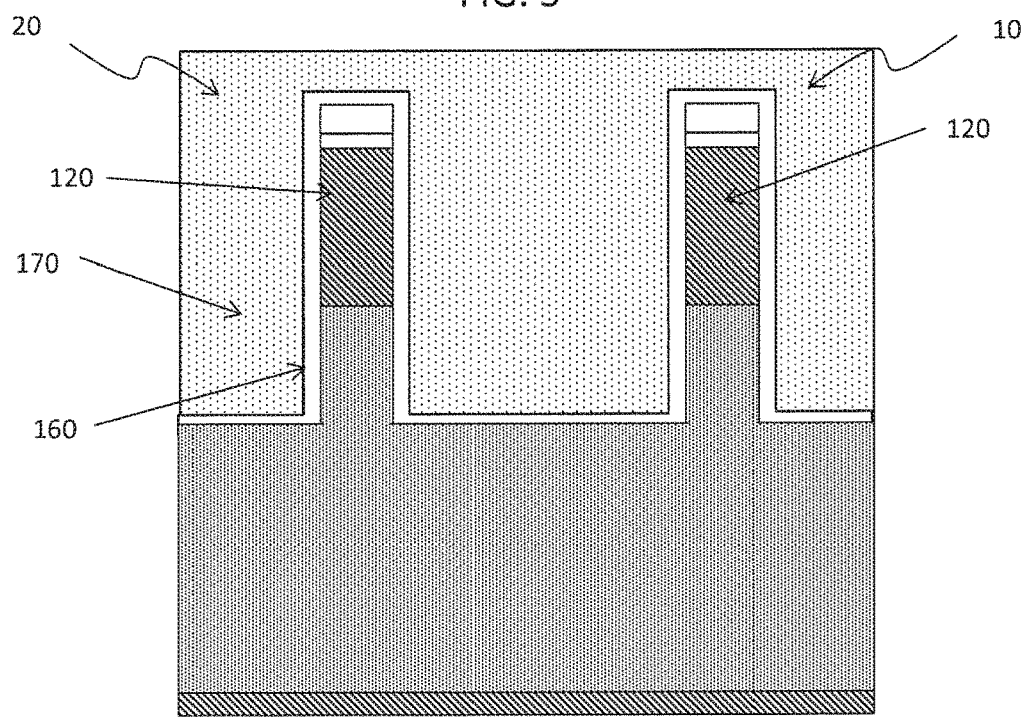

After the protective layer 160 is formed, a sacrificial layer 170 is formed so that the fin structures 10 and 20 are embedded in the sacrificial layer 170, as shown in FIG. 4. The fin structures 10 and 20 may be fully or partially embedded in the sacrificial layer 170. In some embodiments, the sacrificial layer 170 is made of an organic material such as a photo resist layer or a material for a bottom antireflective coating (BARC).

Figure 5:
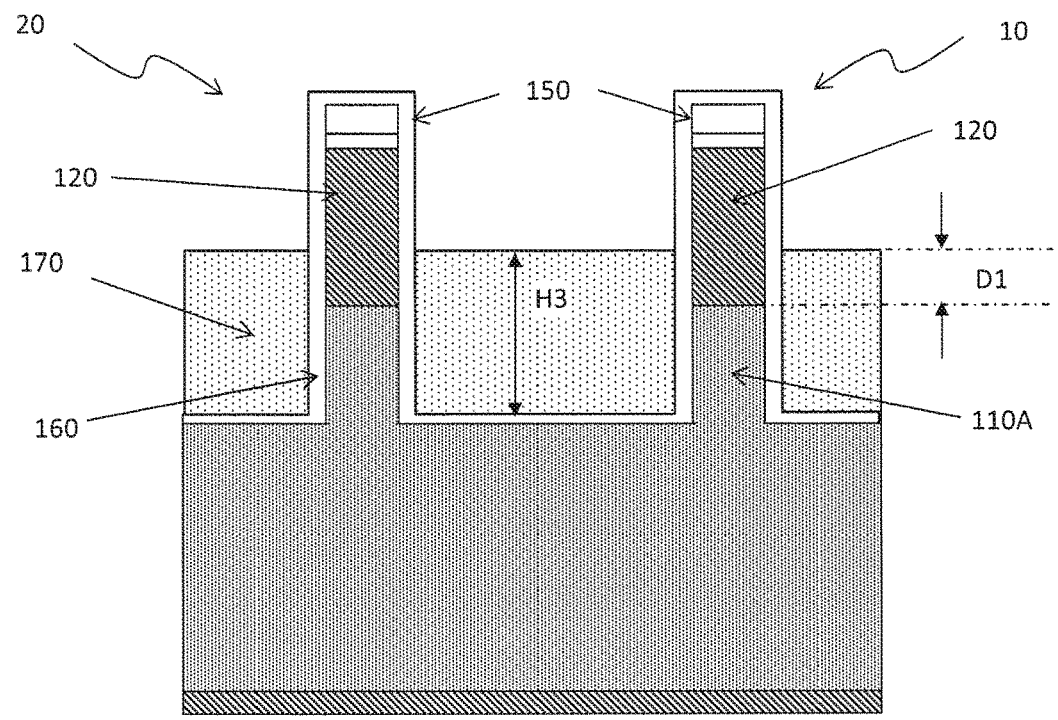

Then, as shown in FIG. 5, the thickness of the sacrificial layer 170 is reduced by, for example, an etch-back process so as to expose a part of the fin structures. The etch-back process may be performed by using plasma including $O_2$ and at least one of $CF_4$ and $CHF_3$, at a temperature in a range about 0° C. to about 300° C. and at a pressure in a range of about 1 to about 10 Torr in certain embodiments. By adjusting etching time, a desired thickness of the remaining sacrificial layer can be obtained. In the present disclosure, the thickness H3 is adjusted to be greater than the height of the interface between the first semiconductor layer 110A and the second semiconductor layer 120 by an amount D1. In some embodiments, the distance D1 is in a range of about 5 nm to about 60 nm, or may be in a range of about 20 nm to 50 nm in other embodiments.

Instead of etching-back the thick sacrificial layer, it may be possible to form a thin sacrificial layer having the target thickness directly by adjusting, for example, the film forming condition.

Figure 6:
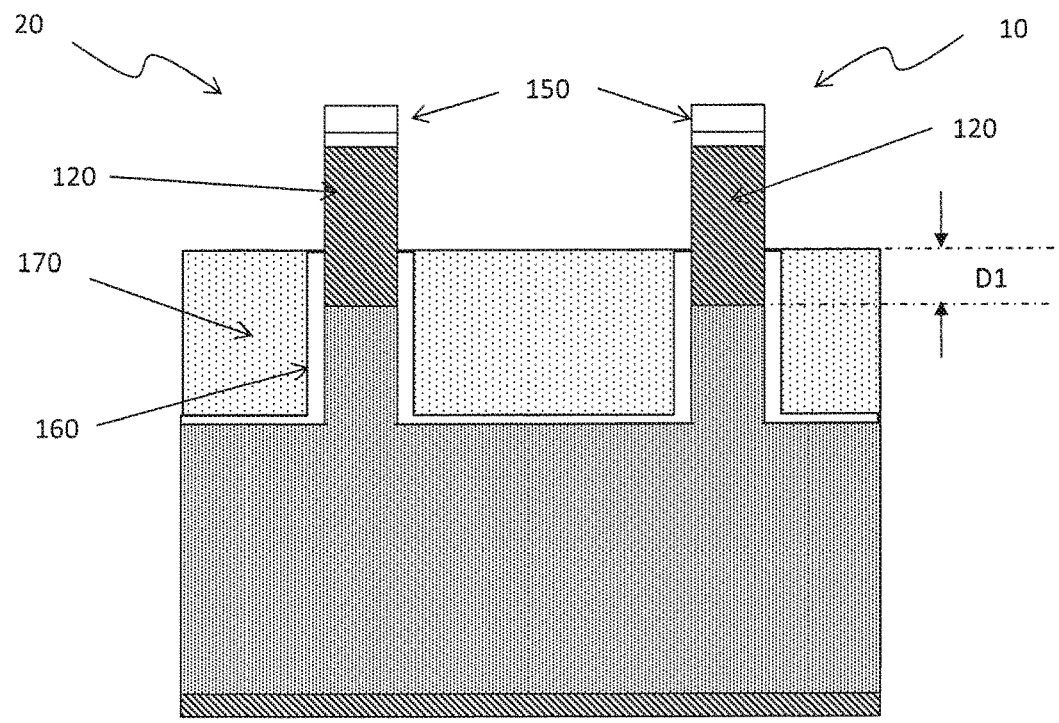

Next, as shown in FIG. 6, the upper portions of the protective layer 160 exposed from the sacrificial layer 170 are removed by, for example, dry etching and/or wet etching. In certain embodiments, the hard mask patterns 150 may also be removed in this process. The remaining sacrificial layer 170 is removed by, for example, an ashing process and/or a wet cleaning process.

Figure 7:
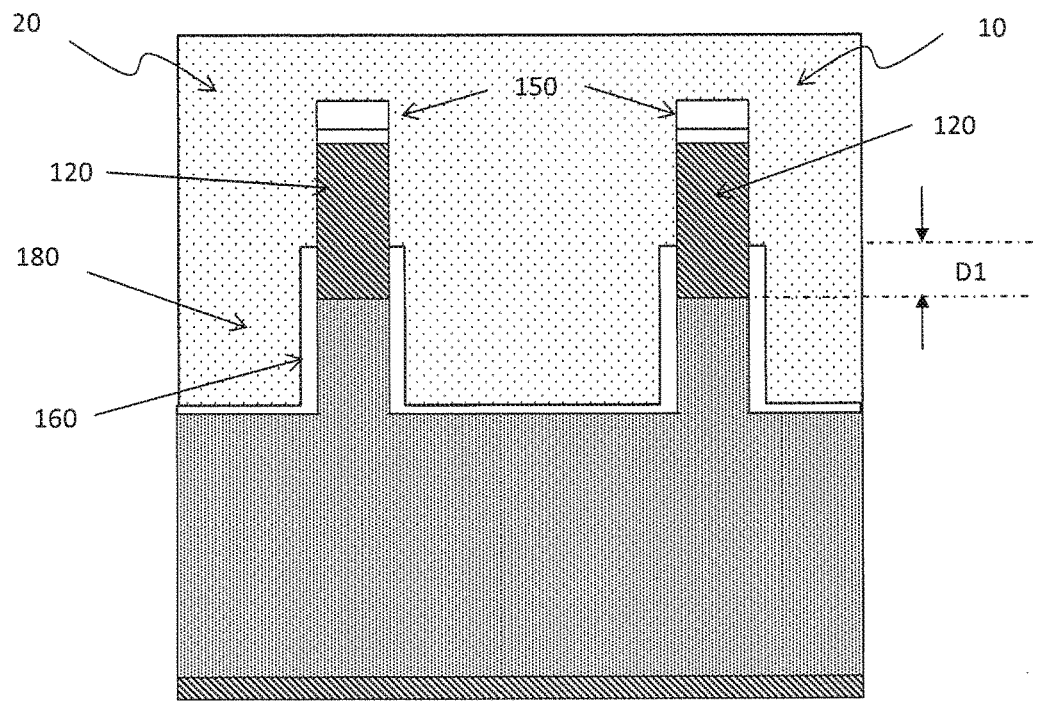

Then, as shown in FIG. 7, isolation insulating layer 180 is formed. The isolation insulating layer 180 is made of one or more layers of, for example, silicon dioxide, SiO, SiON, SiOCN or fluorine-doped silicate glass (FSG), or any other suitable dielectric material. When the isolation insulating layer 180 is made of silicon oxide, the silicon oxide may be doped with, for example, boron and/or phosphorus.

In some embodiments of the present disclosure, the isolation insulating layer 180 may be formed by a flowable CVD (FCVD). In FCVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ a perhydrosilazane (TCPS), a perhydro-polysilazane (PSZ), a tetraethyl orthosilicate (TEOS), or a silylamine, such as trisilylamine (TSA). These flowable silicon oxide materials are formed in a multiple-operation process.

After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once.

In the present embodiment, the temperatures for annealing are also adjusted to relatively lower temperatures, such as in a range from about 500° C. to about 800° C. By using low temperature CVD, it is possible to suppress Ge diffusion between the first semiconductor layer 110 (110A) and the second semiconductor layer 120.

Since the side walls of the bottom portion 110A of the fin structures 10 and 20 are covered by the protective layer 160, the bottom portion 110A of the fin structures 10 and 20 are not oxidized during the thermal process for forming the isolation insulating layer 180.

Figure 8:
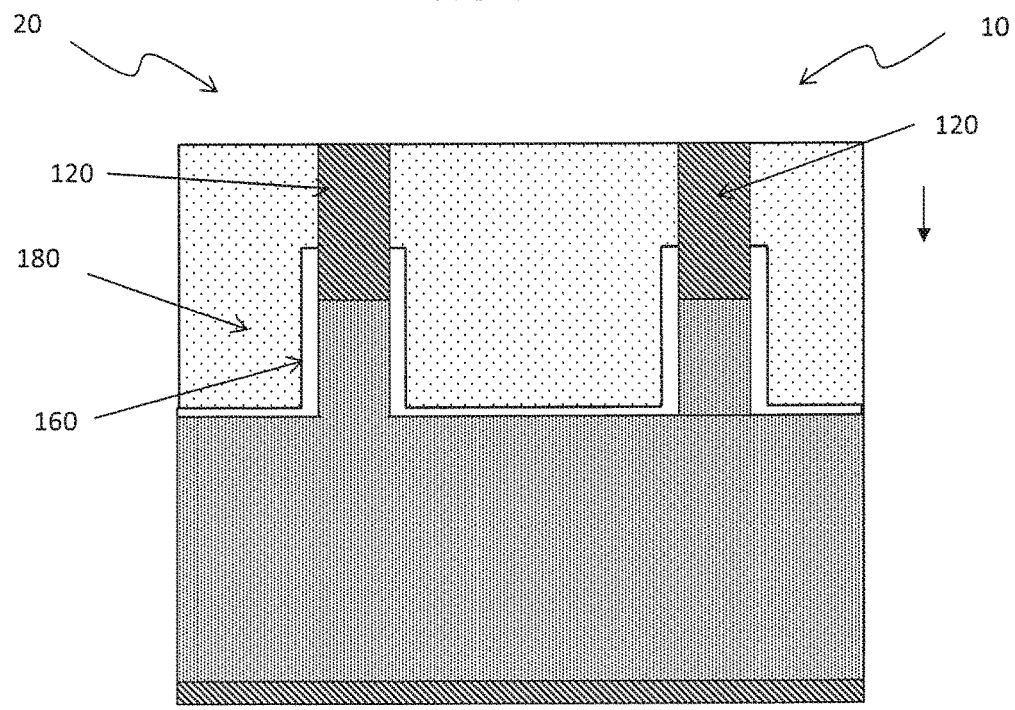

As shown in FIG. 8, the upper portions of the isolation insulating layers 180 and the mask patterns 150 are removed by, for example, a chemical mechanical polishing (CMP) method or other planarization methods such as an etch-back process. The top portions of the upper layers 120 of the fin structures may be slightly etched.

Figure 9:
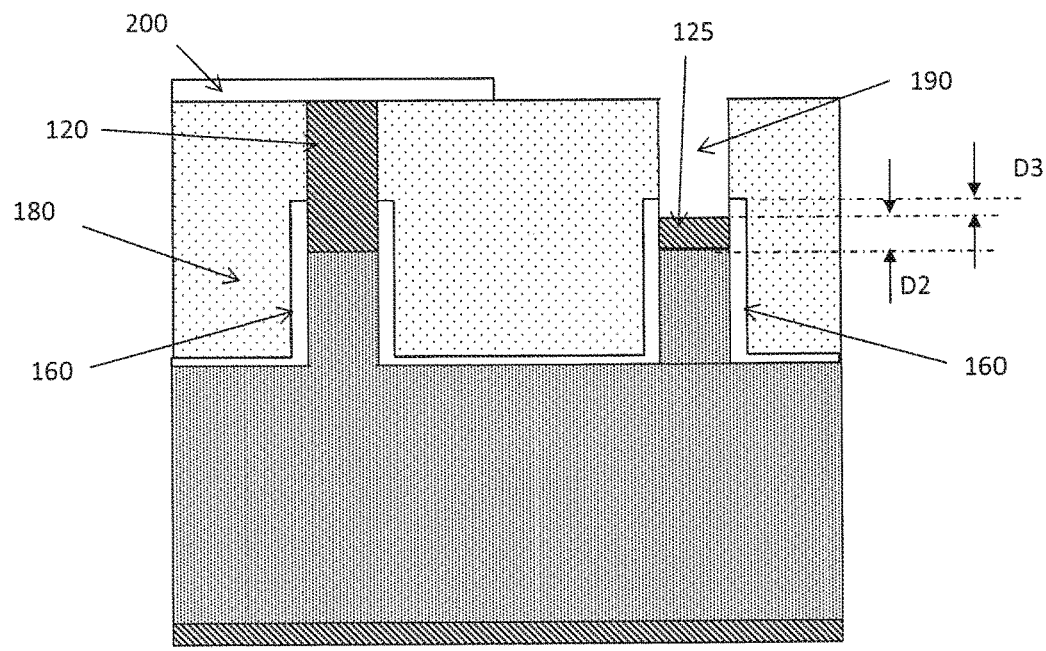

Next, as shown in FIG. 9, a protection hard mask layer 200, for example, a single layer of silicon nitride (in a range of about 10 nm to about 50 nm in some embodiments) or a bilayer of silicon nitride (in a range of about 10 nm to about 50 nm in some embodiments) and silicon oxide (in a range of about 5 nm to 50 nm in some embodiments), is formed over the isolation insulating layer 180 above the fin structure 20 for the n-type Fin FET region. The protection hard mask layer 200 protects the fin structure 20 from the subsequent processes performed on the fin structure 10 for the p-type Fin FET.

By dry etching and/or wet etching, the upper portion made by the second semiconductor layer 120 of the fin structure 10 is partially removed, thereby forming an opening 190 and a remaining second semiconductor layer 125. The etching of the second semiconductor layer 120 may be performed by dry etching and/or wet etching.

The thickness D2 of the remaining second semiconductor layer 125 is in a range of about 5 nm to about 50 nm in some embodiments, or may be in a range of about 5 nm to about 25 nm in other embodiments. By adjusting the etching time and/or conditions, the desired thickness of the remaining second semiconductor layer 125 can be obtained. The distance D3 between the upper end of the protective layer 160 and the upper surface of the remaining second semiconductor layer 125 is in a range of about 5 nm to about 20 nm in some embodiments, or may be in a range of about 5 nm to about 10 nm in other embodiments.

Figure 10:
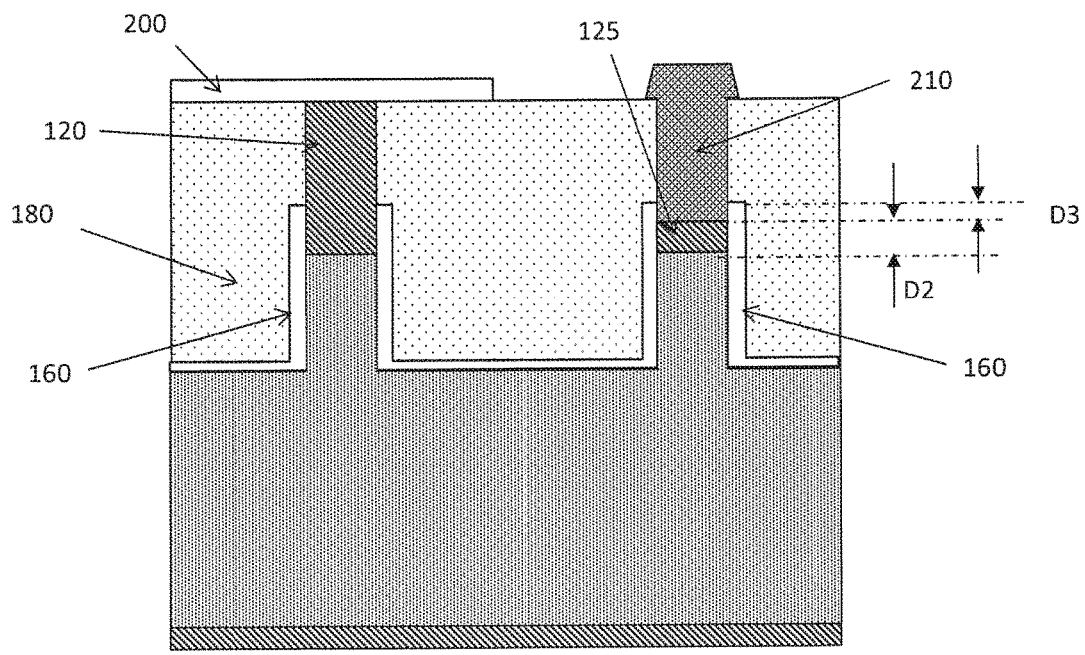

Then, a third semiconductor layer 210 is epitaxially grown on the upper surface of the remaining second semiconductor layer 125 so as to fill the opening 190, as shown in FIG. 10. The third semiconductor layer may be Ge or a $Si_{(1-z)}Ge_z$, where z is larger than x of the first semiconductor layer 110 ($Si_{(1-x)}Ge_x$). In some embodiments, z is equal to or more than about 0.5, and may be in a range of about 0.5 to about 0.75 in other embodiments. As shown in FIG. 10, the third semiconductor layer 210 is also formed above the upper surface of the isolation insulating layer 180.

After the third semiconductor layer 210 is formed, the protection hard mask layer 200 and part of the third semiconductor layer 210 formed above the upper surface of the isolation insulating layer 180 are removed by, for example, a planarization operation such as a CMP.

Figure 11:
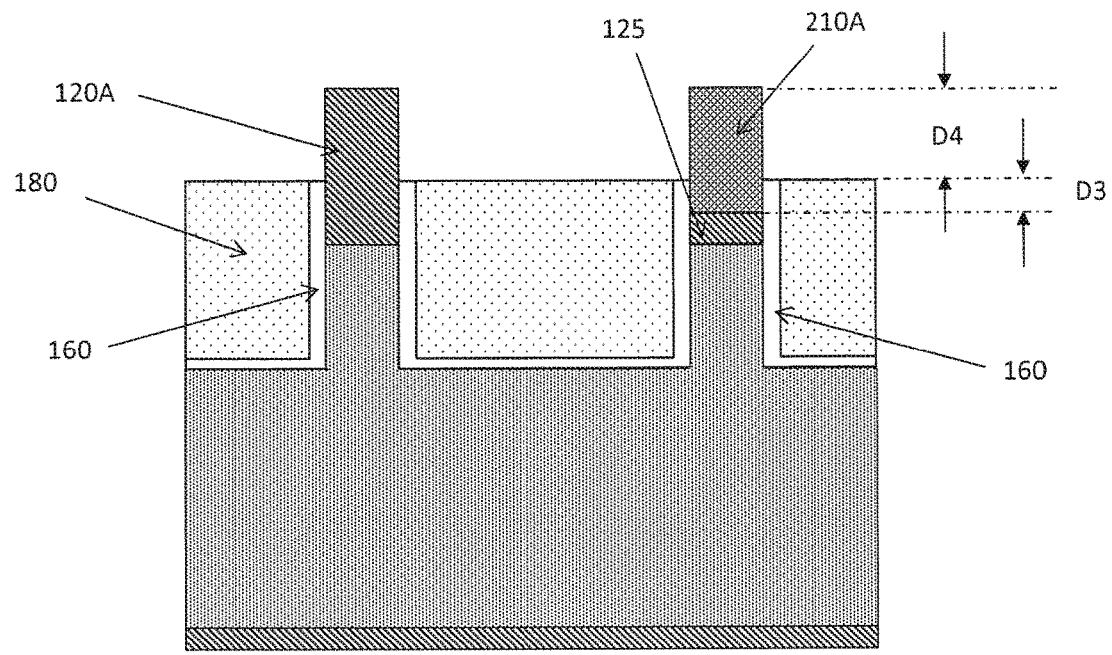

Then, as shown in FIG. 11, the upper portion of the isolation insulating layer 180 is removed (recessed) by, for example, an etch-back process, so that the upper portion of the second semiconductor layer 120 and the upper portion of the third semiconductor layer 210 are exposed from the isolation insulating layer 180. The isolation insulating layer 180 is recessed to the extent that the upper surface of the isolation insulating layer 180 becomes substantially the same height as the upper ends of the protective layer 160. The etch-back process may be performed by using dry etching or wet etching. By adjusting etching time, a desired thickness of the remaining isolation insulating layer 180 can be obtained. In some embodiments, the upper surface of the isolation insulating layer 180 may be located below the upper ends of the protective layer 160, or above the upper ends of the protective layer 160.

The exposed upper portion of the second semiconductor layer 120 becomes a channel region 120A for the n-type Fin FET and the exposed upper portion of the third semiconductor layer 210 becomes a channel region 210A for the p-type Fin FET. The height D4 of the exposed upper portions is in a range of about 20 nm to about 80 nm in some embodiments, and may be in a range of about 30 nm to about 60 nm in other embodiments.

In FIG. 11, the remaining second semiconductor layer 125 is not exposed from the isolation insulating layer 180, and the bottom of the channel regions are embedded in the isolation insulating layer 180.

Figure 12:
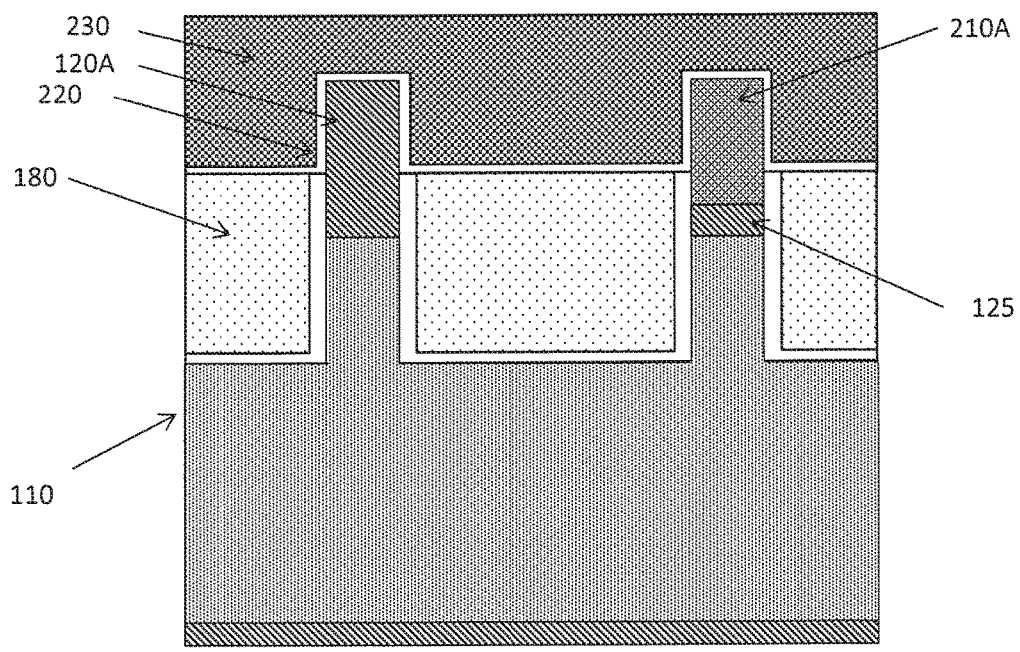

Next, as shown in FIG. 12, a gate structure is formed over part of the channel regions 120A and 210A. A gate dielectric material and a gate electrode material are formed over the isolation insulating layer 180 and the channel regions 120A and 210A, and then patterning operations are performed so as to obtain gate structure including the gate electrode layer 230 and the gate dielectric layer 220. The gate electrode layer 230 is made of one or more conductive material such as poly silicon, Al, Cu, W, Ti, Ta, TiN, TiAl, TiAlN, TaN, NiSi, CoSi, other conductive materials. The electrode layer for the gate electrode layer 230 may be formed using a suitable process such as ALD, CVD, PVD, plating, or combinations thereof.

The gate dielectric layer 220 includes one or more layers of silicon oxide, silicon nitride, silicon oxy-nitride, or high-k dielectrics. High-k dielectrics may include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 220 may be formed using a suitable operation such as atomic layer deposition (ALD), chemical vapor deposition (CVD), physical vapor deposition (PVD), thermal oxidation, UV-ozone oxidation, or combinations thereof. The gate dielectric layer 220 may further include an interfacial layer (not shown) to reduce damage between the gate dielectric layer 220 and the channel regions. The interfacial layer may include silicon oxide.

In some embodiments, one or more work function adjustment layers (not shown) may be interposed between the gate dielectric layer 220 and the gate electrode layer 230. The work function adjustment layer may include a single layer or alternatively a multi-layer structure, such as various combinations of a metal layer with a selected work function to enhance the device performance (work function metal layer), liner layer, wetting layer, adhesion layer, metal alloy or metal silicide. For the n-channel Fin FET, one or more layers of TaN, TaAlC, TiN, TiC, Co, TiAl, HfTi, TiSi and TaSi may be used as the work function adjustment layer, and for the p-channel Fin FET, one or more layers of TiAlC, Al, TiAl, TaN, TaAlC, TiN, TiC and Co may be used as the work function adjustment layer. In some embodiments, the work function adjustment layer may alternatively include a poly-silicon layer. The work function adjustment layer may be formed by ALD, PVD, CVD, e-beam evaporation, or other suitable operation. Further, the work function adjustment layer may be formed separately for the n-channel Fin FET and the p-channel Fin FET, which may use different metal layers.

In FIG. 12, one gate structure is disposed for the n-type Fin FET and the p-type Fin FET. However, the gate structure may be separately disposed for the n-type Fin FET and the p-type Fin FET, respectively.

Figure 13:
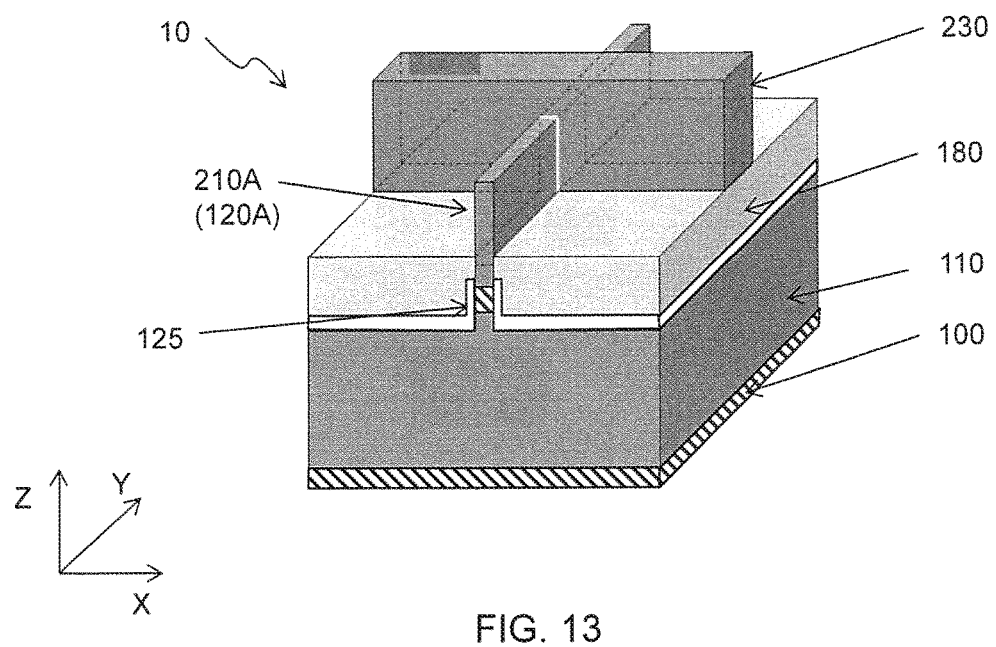
FIG. 13 is an exemplary perspective view corresponding to FIG. 12.

FIG. 13 is an exemplary perspective view corresponding to FIG. 12, illustrating one of Fin FETs of FIG. 12.

After the gate structure is formed, source and drain 240 are formed. The source and drain 240 may be formed by forming silicide layers on the upper portions of the fin structure not covered by the gate structure in some embodiments. In other embodiments, the upper portions of the fin structure not covered by the gate structure is recessed below the upper surface of the isolation insulating layer 180, and a strain material is re-grown over the recessed fin structure. The strain material may include one or more layers of Si, SiC, SiCP, SiP, SiCP, SiGe or Ge.

Figures 14A, 14B:
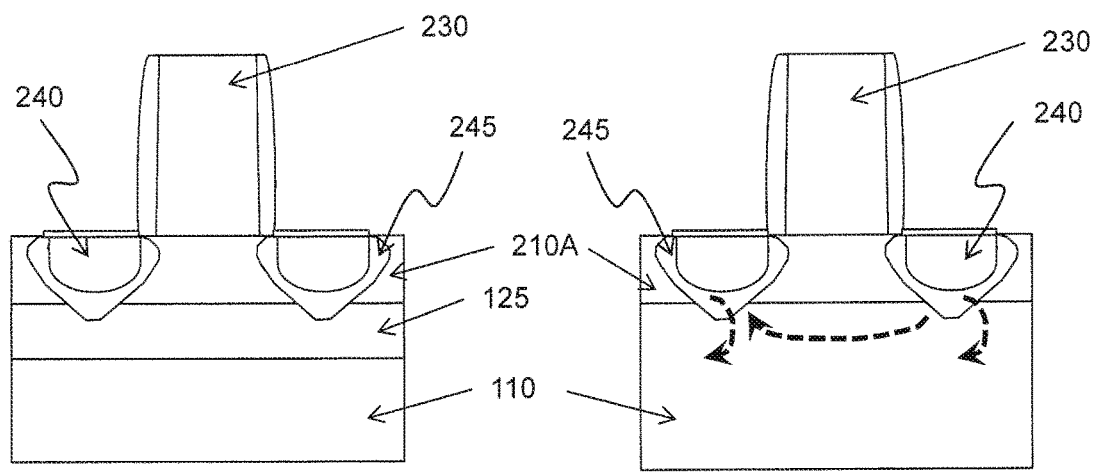
FIGS. 14A and 14B are exemplary cross sectional views of source/drain structures.

FIGS. 14A and 14B are exemplary cross sectional views of source/drain structures. In the present embodiment, the remaining second semiconductor layer 125 (made of e.g., Si) is disposed between the first semiconductor layer 110 and the channel region 210A in the p-type Fin FET. With this structure, even when depletion region 245 below the source/drain 240 expands, there is no current leakage path from the source/drain to the first semiconductor layer 110 and/or between the source and drain, as shown in FIG. 14A. In contrast, if there is no such remaining second semiconductor layer 125 (made of e.g., Si) between the first semiconductor layer 110 and the channel region 210A, there would be current leakage path from the source/drain to the first semiconductor layer 110 and/or between the source and drain, as shown in FIG. 14B.

Further, by interposing the remaining second semiconductor layer 125 (made of e.g., Si) is disposed between the first semiconductor layer 110 (made of e.g., for example $Si_{(1-x)}Ge_x$, where x is in a range of about 0.1 to about 0.5) and the channel region 210A (made of, for example, for example Ge or a $Si_{(1-z)}Ge_z$, where z is larger than x of the first semiconductor layer 110 ($Si_{(1-x)}Ge_x$)), it is possible to suppress Ge diffusion between the first semiconductor layer 110 and the channel region 210A. In addition, by reducing annealing temperature for the isolation insulating layer 180, the Ge diffusion can be further suppressed.

In some embodiments, during thermal operations after forming the third semiconductor layer 210, Ge in the first and/or third semiconductor layers may diffuse into the remaining second semiconductor layer 125. Accordingly, the remaining second semiconductor layer 125 may contain Ge in an amount of about 10 atm % or less. In other embodiments, the Ge amount in the remaining second semiconductor layer 125 may be less than about 5 atm %.

It is understood that the Fin FET device may undergo further CMOS processes to form various features such as contacts/vias, interconnect metal layers, dielectric layers, passivation layers, etc.

Figure 15:
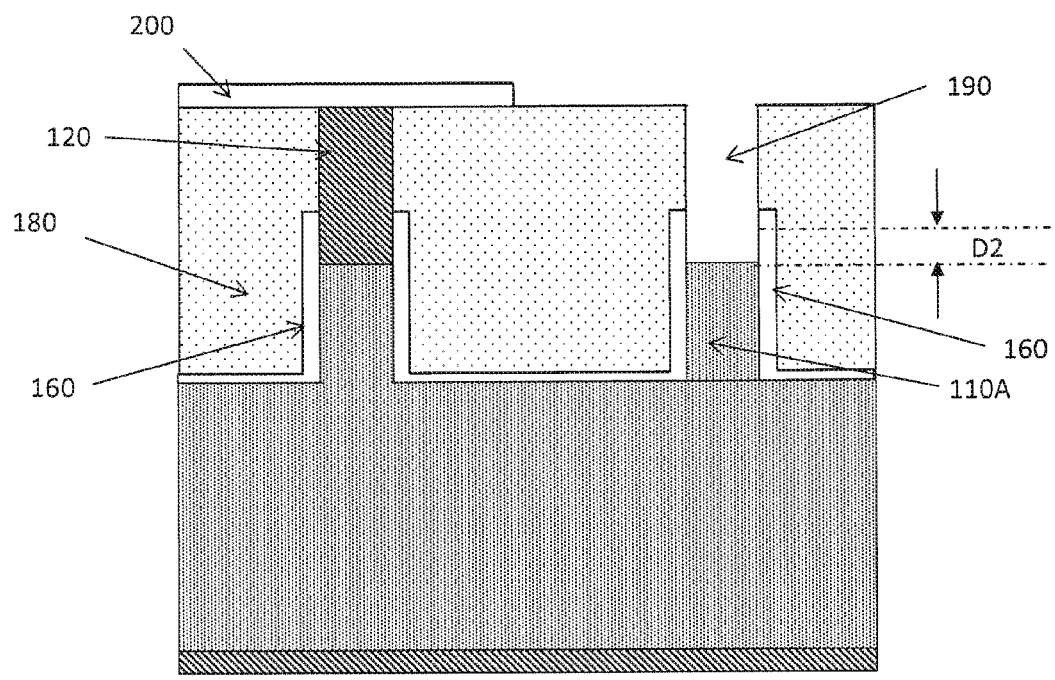
FIGS. 15 and 16 are cross sectional views illustrating a sequential process for manufacturing a semiconductor FET device according to a modified embodiment of the present disclosure.
Figure 16:
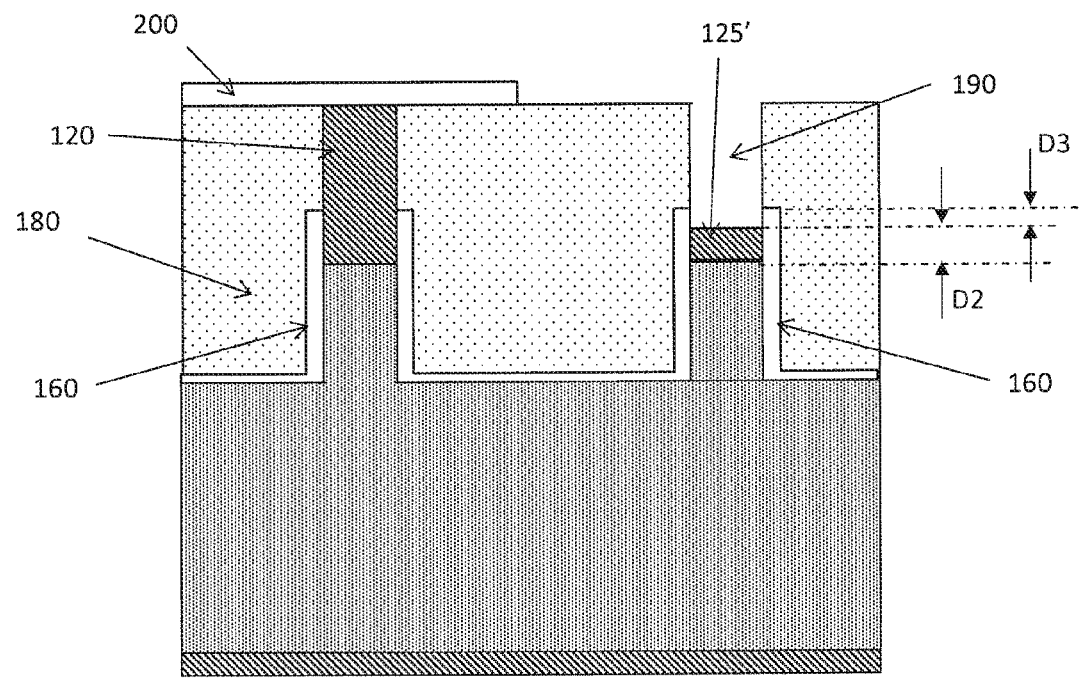

FIGS. 15 and 16 are cross sectional views illustrating a sequential process for manufacturing a semiconductor FET device according to a modified embodiment of the present disclosure.

In FIG. 9 of the above embodiment, the second semiconductor layer 120 for the p-type Fin FET is partially etched and the bottom part of the second semiconductor layer 120 remains in the opening 190. The etching of the second semiconductor layer 120 may be performed by dry etching and/or wet etching.

In the modified embodiment, as shown in FIG. 15, the second semiconductor layer 120 for the p-type Fin FET is substantially fully etched so as to expose the upper surface of the first semiconductor layer 110A. Then, as shown in FIG. 16, a fourth semiconductor layer 125' is formed over the exposed upper surface of the first semiconductor layer 110A in the opening 190, with a desired thickness D2. The fourth semiconductor layer 125' is made of, for example, Si or $Si_{(1-y)}Ge_y$, where y is less than about 0.1. In this modified embodiment, the material for the fourth semiconductor layer can be independently selected from the material for the channel region 120A (the second semiconductor layer) in the n-type Fin FET. Further, the thickness D2 can be more precisely controlled by using a relatively slow epitaxial growth for the fourth semiconductor layer 125', compared with partially etching the second semiconductor layer. Moreover, it is possible to form the third semiconductor layer 210 continuously over the fourth semiconductor layer 125' by changing a source gas(es).

FIGS. 17-24 are exemplary cross sectional views illustrating a sequential process for manufacturing a semiconductor FET device according to another embodiment of the present disclosure. It is understood that additional operations can be provided before, during, and after the operations shown by FIGS. 17-24, and some of the operations described below can be replaced or eliminated for additional embodiments of the method. The order of the operations may be interchangeable. Further, some of the features, materials, structures, processes and/or operations of this embodiment are substantially the same as or similar to those in the aforementioned embodiments with respect to FIGS. 1-16, and the detailed explanation thereof may be omitted.

Figure 17:
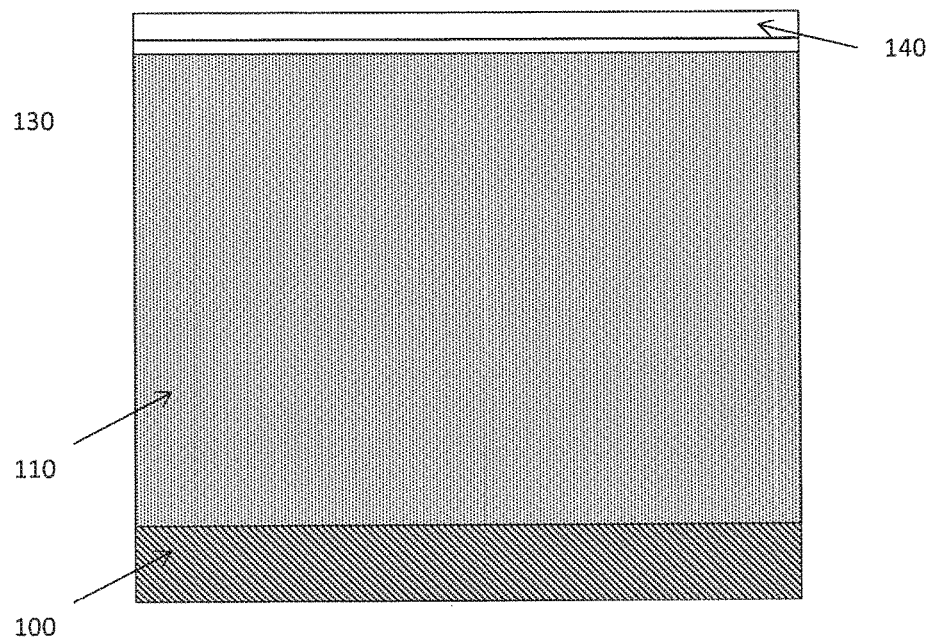
FIGS. 17-24 are exemplary cross sectional views illustrating a sequential process for manufacturing a semiconductor FET device according to another embodiment of the present disclosure.

As shown in FIG. 17, a first semiconductor layer 110 is epitaxially grown over the surface of the substrate 100. Further, a mask layer including a first layer 130 and a second layer 140 is formed over the second semiconductor layer 120.

The first semiconductor layer 110 is, for example $Si_{(1-x)}Ge_x$, where x is in a range of about 0.1 to about 0.5. In some embodiments, x in $Si_{(1-x)}Ge_x$ may be in a range of about 0.2 to about 0.4. The thickness of the SiGe first semiconductor layer 110 is in a range of about 0.5 µm to about 2 µm in some embodiments. By growing a relatively thick SiGe layer 110 over the Si substrate 100, the stress induced in the SiGe layer 110 can be reduced and relaxed. In some embodiments, the thickness of the SiGe first semiconductor layer 110 is in a range of about 1 µm to about 1.5 µm. In certain embodiments, a Ge layer or a $Si_{(1-x)}Ge_x$, where x is less than about 0.1, may be used as the first semiconductor layer 110. In other embodiments, III-V compound semiconductors such as GaAs, GaP, GaN, InP, InAs, InSb, GaAsP, AlGaN, AlInAs, AlGaAs, GaInAs, GaInP, and/or GaInAsP may be used as the first semiconductor layer 110.

The first semiconductor layer 110 may be doped or may not be doped. The doping may be performed during the epitaxial growth of the first semiconductor layer 110 or may be performed by ion implantation.

The mask layer may include, for example, a pad oxide (e.g., silicon oxide) layer 130 and a silicon nitride (SiN) mask layer 140 in some embodiments. The thickness of the pad oxide layer is in a range of about 2 nm to about 15 nm and the thickness of the silicon nitride mask layer is in a range of about 10 nm to about 50 nm in some embodiments.

Figure 18:
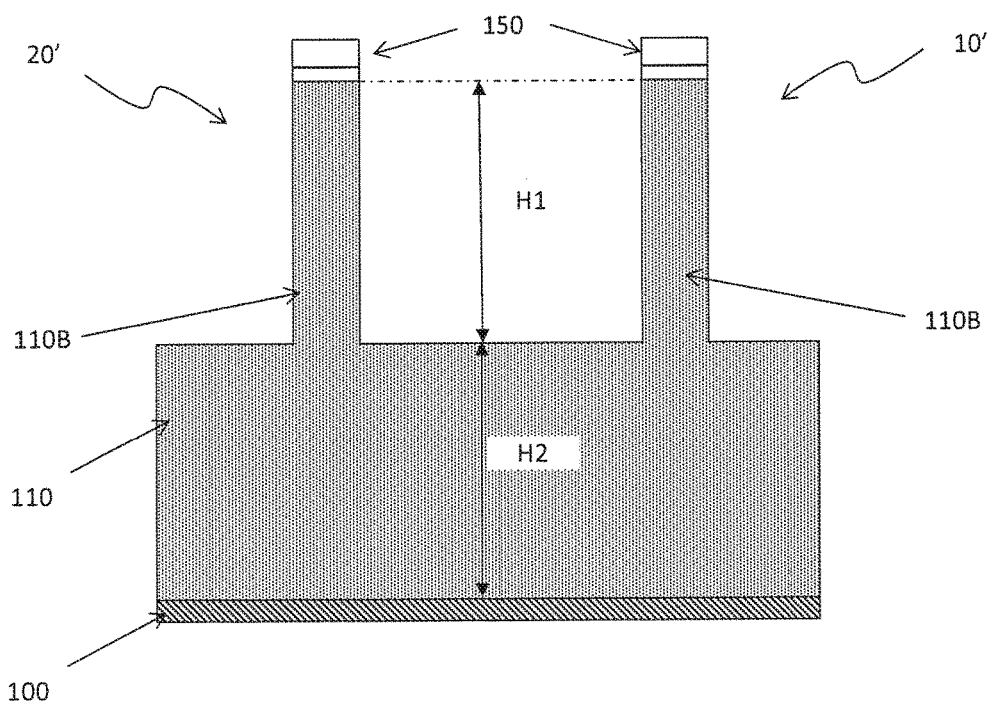

As shown in FIG. 18, the first semiconductor layer 110 is patterned into fin structures. Similar to FIG. 2, by using the mask pattern 150 as etching masks, the first semiconductor layer 110 is pattered into fin structures 110B (10' and 20') by trench etching using a dry etching method and/or a wet etching method. As shown in FIG. 18, the trench etching is performed through to the middle of the first semiconductor layer 110. The fin structure 10' is for a p-type Fin FET and the fin structure 20' is for an n-type Fin FET.

The width of the fin structures 110B is in a range of about 5 nm to about 40 nm in some embodiments, and may be in a range of about 7 nm to about 15 nm in certain embodiments. The height H1 of the fin structures 110B is in a range of about 50 nm to about 300 nm in some embodiments, and may be in a range of about 100 nm to 200 nm in other embodiments. The space between adjacent fin structures is in a range of about 5 nm to about 80 nm in some embodiments, and may be in a range of about 7 nm to 15 nm in other embodiments. The remaining thickness H2 of the first semiconductor layer 110 is in a range of about 500 µm to about 800 µm.

Figure 19:
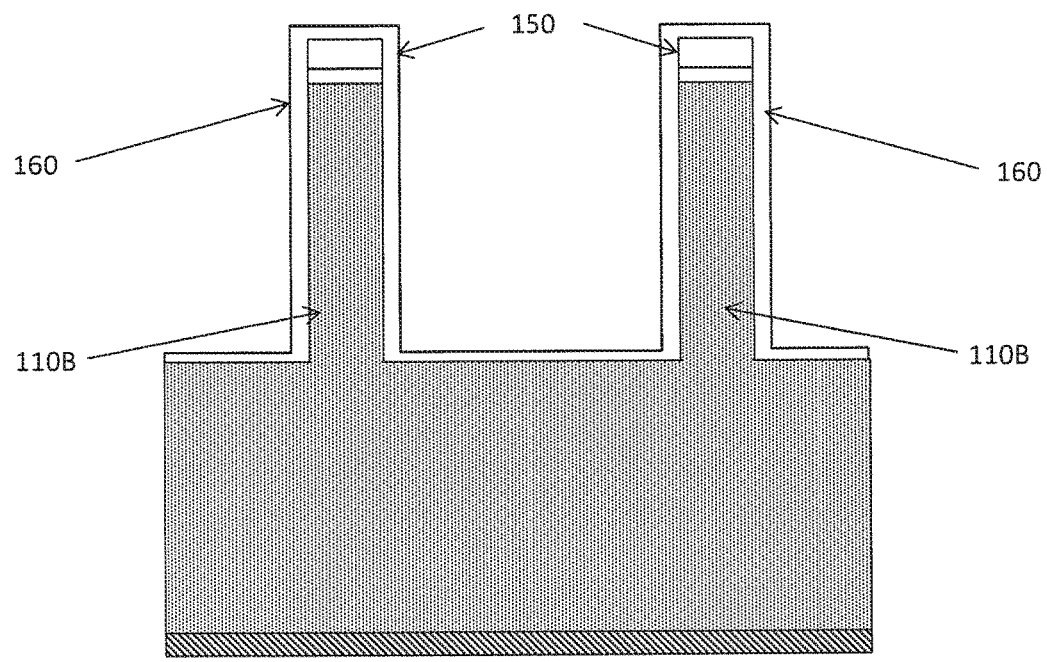

After forming the fin structures, similar to FIG. 3, a protective layer 160 is formed to cover the fin structures 110B, as shown in FIG. 19. The protective layer 160 is made of a material that prevents the first semiconductor layer from being oxidized. In some embodiments, the protective layer 160 is made of one or more layers of silicon nitride (SiN), SiC, SiOCN and SiCN. The thickness of the protective layer 160 is in a range of about 1 nm to about 10 nm in some embodiments. In certain embodiments, the thickness of the protective layers 160 is in a range of about 2 nm to about 5 nm in some embodiments. In this embodiment, SiN is used as the protective layers 160. The protective layer 160 is formed by chemical vapor deposition CVD, plasma-enhanced chemical vapor deposition (PECVD), atmospheric pressure chemical vapor deposition (APCVD), a low-pressure CVD (LPCVD), high density plasma CVD (HDPCVD) and/or atomic layer deposition (ALD), and/or other suitable processes.

During the film formation process, the substrate temperature is in a range of 300° C. to 500° C. In some embodiments, the substrate temperature may be in a range of 350° C. to 450° C. By maintaining the substrate temperature relatively lower than a typical CVD process during the film formation process, it is possible to suppress diffusion of germanium in the first semiconductor layer into the second semiconductor layer. In some embodiments, PECVD is utilized.

After the protective layer 160 is formed, similar to FIG. 4, a sacrificial layer 170 is formed so that the fin structures 110B are embedded in the sacrificial layer 170. The fin structures 110B may be fully or partially embedded in the sacrificial layer 170. In some embodiments, the sacrificial layer 170 is made of an organic material such as a photo resist layer or a material for a bottom antireflective coating (BARC).

Figure 20:
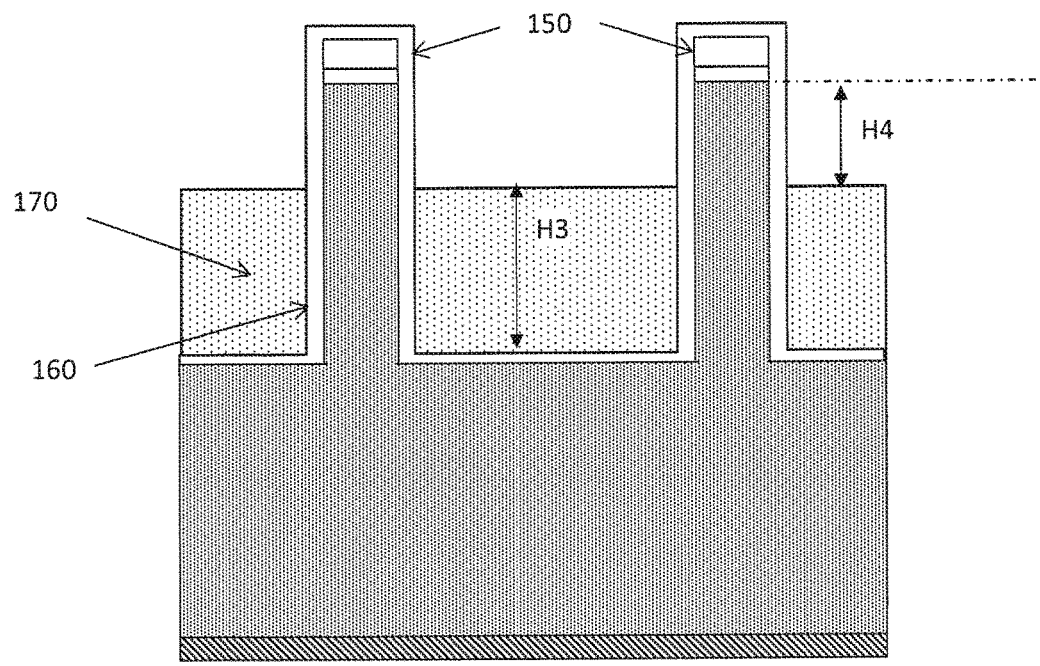

Then, similar to FIG. 5, the thickness of the sacrificial layer 170 is reduced by, for example, an etch-back process so as to expose a part of the fin structures, as shown in FIG. 20. The etch-back process may be performed by using plasma including $O_2$ and at least one of $CF_4$ and $CHF_3$, at a temperature in a range about 0° C. to about 300° C. and at a pressure in a range of about 1 to about 10 Torr in certain embodiments. By adjusting etching time, a desired thickness of the remaining sacrificial layer can be obtained. In the present disclosure, the thickness H3 is in a range of about 20 nm to about 80 nm in some embodiments, and may be in a range of about 30 nm to about 60 nm in other embodiments.

Instead of etching-back the thick sacrificial layer, it may be possible to form a thin sacrificial layer having the target thickness directly by adjusting, for example, film forming condition.

Figure 21:
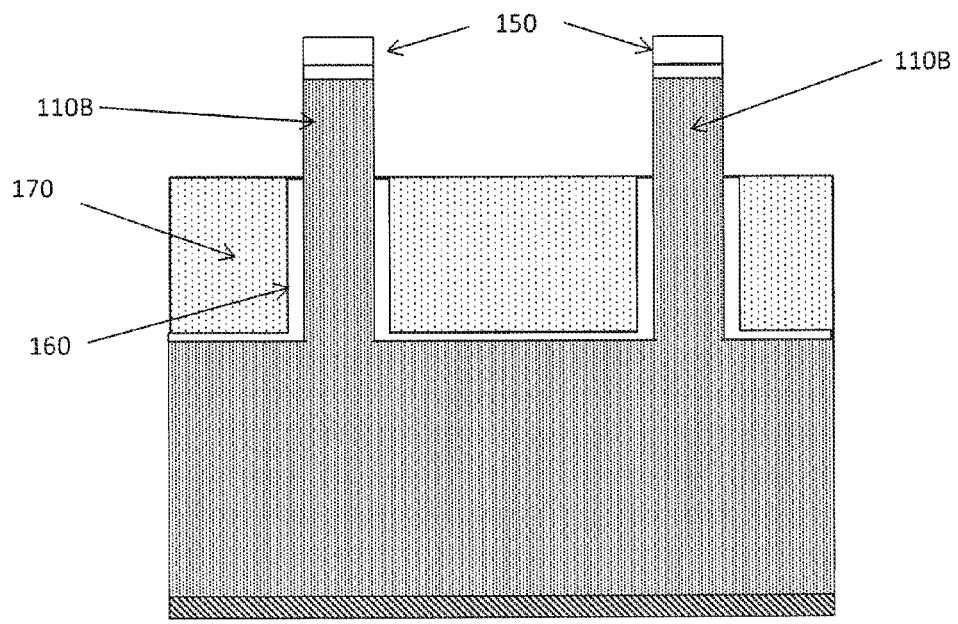

Next, similar to FIG. 6, the upper portions of the protective layer 160 exposed from the sacrificial layer 170 are removed by, for example, dry etching and/or wet etching, as shown in FIG. 21.

Then, similar to FIG. 7, isolation insulating layer 180 is formed. The isolation insulating layer 180 is made of one or more layers of, for example, silicon dioxide, SiO, SiON, SiOCN or fluoridne-doped silicate glass (FSG), or any other suitable dielectric material. When the isolation insulating layer 180 is made of silicon oxide, the silicon oxide may be doped with, for example, boron and/or phosphorus. In some embodiments of the present disclosure, the isolation insulating layer 180 may be formed by a flowable CVD (FCVD).

After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. In the present embodiment, the temperatures for annealing are also adjusted to relatively lower temperatures, such as in a range from about 500° C. to about 800° C. Since the side walls of the bottom portion of the fin structures 110B are covered by the protective layer 160, the bottom portion of the fin structures 110B are not oxidized during the thermal process for forming the isolation insulating layer 180.

Figure 22:
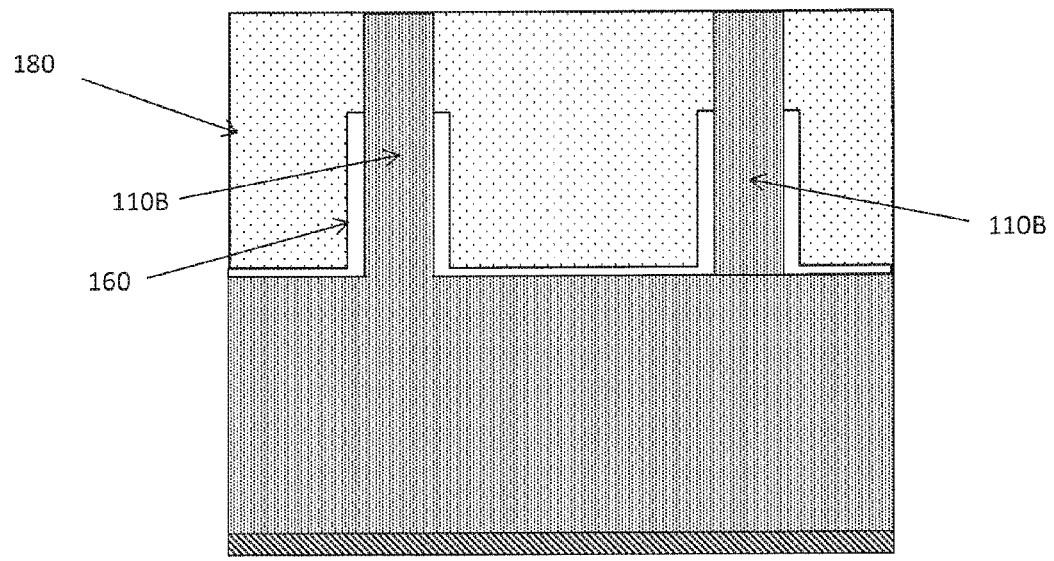

Similar to FIG. 8, the upper portions of the isolation insulating layers 180 and the mask patterns 150 are removed by, for example, a chemical mechanical polishing (CMP) method or other planarization methods such as an etch-back process, as shown in FIG. 22.

Figure 23:
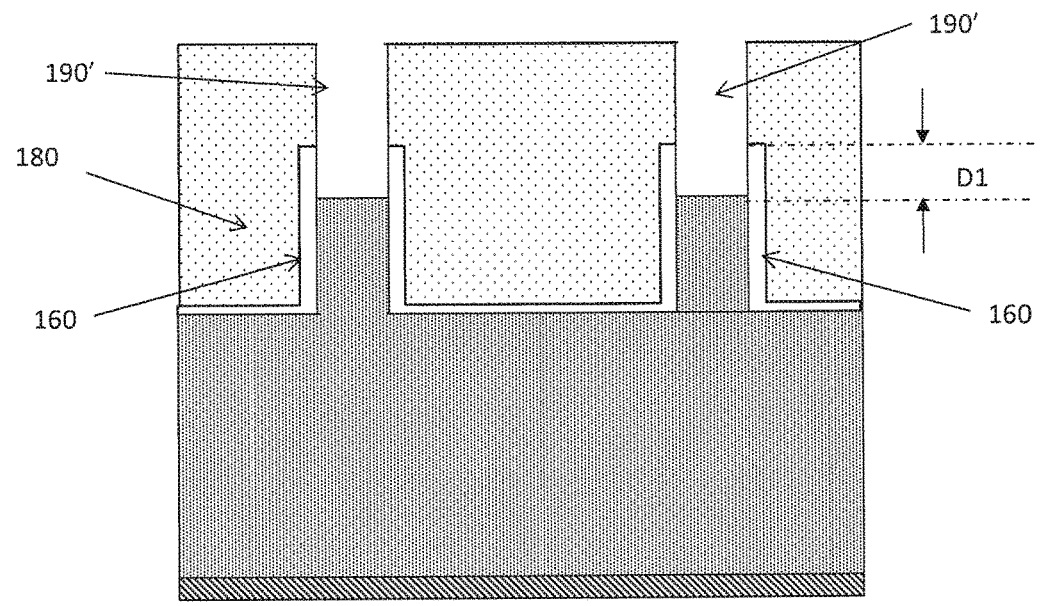

Then, as shown in FIG. 23, the upper portions of the fin structures 110B are partially recessed, thereby forming openings 190'. The etching of the upper portions of the fin structures 110B may be performed by dry etching and/or wet etching. In this embodiment, the upper portions of the fin structures 110B is etched to the depth D1 measured from the upper end of the protective layers 160. In some embodiments, the distance D1 is in a range of about 10 nm to about 60 nm, or may be in a range of about 20 nm to 50 nm in other embodiments.

Figure 24:
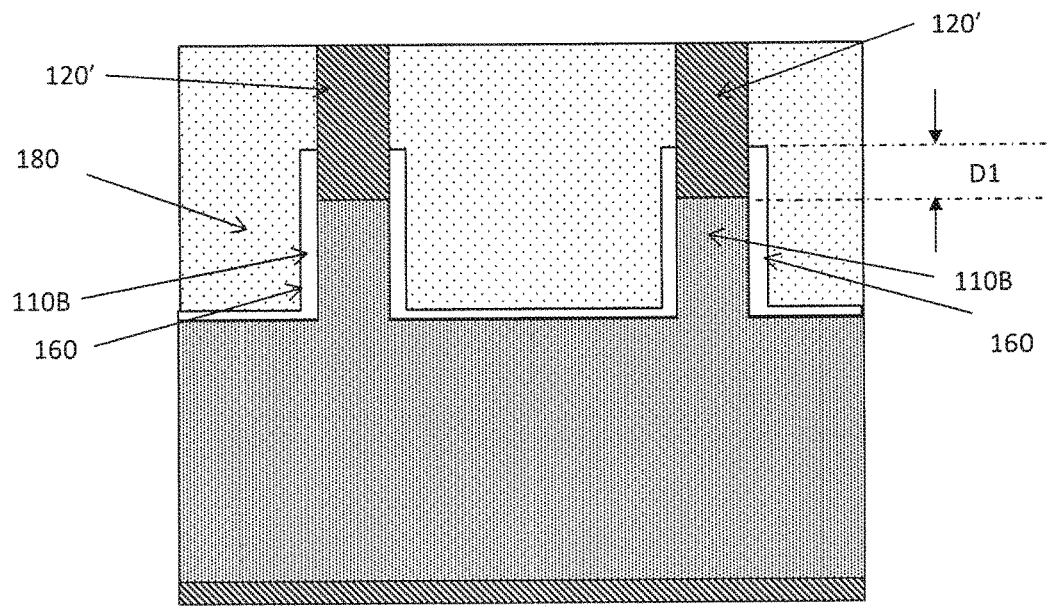

After forming the openings 190', the fifth semiconductor layers 120' are epitaxially formed in the openings 190', as shown in FIG. 24. The fifth semiconductor layer 120' is, for example, Si or $Si_{(1-y)}Ge_y$, where y is less than about 0.1. In this embodiment, the second semiconductor layer is Si. The fifth semiconductor layer 120' has a thickness in a range of about 30 nm to about 200 nm in some embodiments. In certain embodiments, the thickness of the fifth semiconductor layer 120' is in a range of about 50 nm to about 150 nm. The resultant structure shown in FIG. 24 is substantially the same as that shown in FIG. 8.

After the structure of FIG. 24 is formed, the similar operations of FIG. 9-12 or 15-16 are performed to obtain the structures of FIGS. 12 and 13. It is understood that the Fin FET device may undergo further CMOS processes to form various features such as contacts/vias, interconnect metal layers, dielectric layers, passivation layers, etc.

The various embodiments or examples described herein offer several advantages over the existing art. In some embodiments of the present disclosure, by interposing the remaining second semiconductor layer (made of e.g., Si) is disposed between the first semiconductor layer (made of e.g., for example $Si_{(1-x)}Ge_x$, where x is in a range of about 0.1 to about 0.5) and the channel region (made of, for example, for example Ge or a $Si_{(1-z)}Ge_z$, where z is larger than x of the first semiconductor layer ($Si_{(1-x)}Ge_x$)) in a p-type FET, it is possible to suppress Ge diffusion between the first semiconductor layer and the channel region. In addition, by reducing annealing temperature for the isolation insulating layer, the Ge diffusion can be further suppressed. Moreover, it is possible to suppress leakages at the source drain regions.

It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, a first semiconductor layer is formed on a substrate. A second semiconductor layer is formed on the first semiconductor layer. A fin structure is formed by patterning the first and second semiconductor layers. The fin structure includes a bottom portion constituted of the first semiconductor layer and an upper portion constituted of the second semiconductor layer. A cover layer is formed on a bottom part of the fin structure so as to cover side walls of the bottom portion of the fin structure and a bottom part of side walls of the upper portion of the fin structure. An insulating layer is formed over the fin structure with the cover layer so that the fin structure is embedded in the insulating layer. A part of the upper portion of the fin structure is removed so that an opening is formed in the insulating layer and a layer of the second semiconductor layer remains in bottom of the opening. A third semiconductor layer is formed in the opening on the remaining layer of the second semiconductor layer. The insulating layer is recessed so that at least a part of the third semiconductor layer is exposed from the insulating layer. A gate structure is formed over the exposed third semiconductor layer.

In accordance with another aspect of the present disclosure, in a method for manufacturing a semiconductor device, a first semiconductor layer is formed on a substrate. A second semiconductor layer is formed on the first semiconductor layer. A first fin structure and a second fin structure are formed by patterning the first and second semiconductor layers. The first and second fin structures respectively include a bottom portion constituted of the first semiconductor layer and an upper portion constituted of the second semiconductor layer. A cover layer is formed on bottom parts of the first and second fin structures so as to cover side walls of the bottom portions of the first and second fin structures and bottom parts of side walls of the upper portion of the first and second fin structures. An insulating layer is formed over the first and second fin structures with the cover layer so that the first and second fin structures are embedded in the insulating layer. A part of the upper portion of the first fin structure is removed so that an opening is formed in the insulating layer and a layer of the second semiconductor layer remains in bottom of the opening, while protecting the upper portion of the second fin structure so as not to be etched. A third semiconductor layer is formed in the opening on the remaining layer of the second semiconductor layer. The insulating layer is recessed so that at least a part of the third semiconductor layer and a part of the upper portion of the second fin structure are exposed from the insulating layer. A first gate structure is formed over the exposed third semiconductor layer and a second gate structure is formed over the exposed portion of the second fin structure.

In accordance with another aspect of the present disclosure, a semiconductor device includes a first Fin FET device. The first Fin FET device includes a first fin structure extending in a first direction and protruding from an isolation insulating layer. The first fin structure and the isolation insulating layer are disposed over a substrate. The first fin structure includes a first layer made of a first semiconductor material, a second layer made of a second semiconductor material disposed over the first layer and a third layer made of a third semiconductor material disposed over the second layer. The first Fin FET further includes a first cover layer disposed on a bottom part of the first fin structure so as to cover side walls of the bottom portion of the first fin structure and a bottom part of side walls of the upper portion of the first fin structure. The first Fin FET further includes a first gate stack including a gate electrode layer and a gate dielectric layer, covering a portion of the first fin structure and extending in a second direction perpendicular to the first direction. The third layer functions as a channel region of the first Fin FET. The first semiconductor material includes $Si_{(1-x)}Ge_x$, the second semiconductor material includes $Si_{(1-y)}Ge_y$, and the third semiconductor material includes Ge or a $Si_{(1-z)}Ge_z$, where y is smaller than x, and z is larger than y.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a first semiconductor layer on a substrate;
    forming a second semiconductor layer on the first semiconductor layer;
    forming a fin structure by patterning the first and second semiconductor layers, the fin structure including a bottom portion constituted of the first semiconductor layer and an upper portion constituted of the second semiconductor layer;
    forming a cover layer on a bottom part of the fin structure so as to cover side walls of the bottom portion of the fin structure and a bottom part of side walls of the upper portion of the fin structure;
    forming an insulating layer over the fin structure with the cover layer so that the fin structure is embedded in the insulating layer;
    removing the upper portion of the fin structure so that an opening is formed in the insulating layer and the first semiconductor layer is exposed in a bottom portion of the opening;
    forming a third semiconductor layer on the exposed first semiconductor layer in the opening;
    forming a fourth semiconductor layer in the opening on the third semiconductor layer;
    recessing the insulating layer so that at least a part of the fourth semiconductor layer is exposed from the insulating layer; and
    forming a gate structure over the exposed fourth semiconductor layer.

2. The method of claim 1, wherein:
    the first semiconductor layer includes $Si_{(1-x)}Ge_x$,
    the third semiconductor layer includes $Si_{(1-y)}Ge_y$,
    the fourth semiconductor layer includes Ge or a $Si_{(1-z)}Ge_z$, and
    y is smaller than x, and
    z is larger than y.

3. The method of claim 2, wherein x is in a range of 0.1 to 0.5.

4. The method of claim 2, wherein y is equal to zero or less than 0.1.

5. The method of claim 4, wherein:
    in the forming the third semiconductor layer on the first semiconductor layer, Si is formed as the third semiconductor layer, and
    after the forming a gate structure, the remaining layer of the third semiconductor layer contains Ge in an amount of less than 10 atm %.

6. The method of claim 2, wherein z is equal to or more than 0.5.

7. The method of claim 1, wherein the forming a cover layer includes:
    forming a blanket layer of a cover layer material over the fin structure;
    forming a sacrificial layer to cover a bottom portion of the fin structure with the blanket layer so that an upper portion of the fin structure with the blanket layer is exposed from the sacrificial layer; and
    removing the blanket layer on the upper portion of the fin structure exposed from the sacrificial layer.

8. The method of claim 1, wherein an upper end of the cover layer is 10 nm to 60 nm higher than an interface between the first semiconductor layer and the second semiconductor layer.

9. The method of claim 1, wherein the cover layer includes silicon nitride.

10. The method of claim 1, wherein the insulating layer is formed by CVD followed by annealing at a temperature less than 800° C.

11. A method for manufacturing a semiconductor device, comprising:
    forming a first semiconductor layer on a substrate;
    forming a second semiconductor layer on the first semiconductor layer;
    forming a first fin structure and a second fin structure by patterning the first and second semiconductor layers, the first and second fin structures respectively including a bottom portion constituted of the first semiconductor layer and an upper portion constituted of the second semiconductor layer;
    forming a cover layer on bottom parts of the first and second fin structures so as to cover side walls of the bottom portions of the first and second fin structures and bottom parts of side walls of the upper portion of the first and second fin structures;
    forming an insulating layer over the first and second fin structures with the cover layer so that the first and second fin structures are embedded in the insulating layer;
    removing the upper portion of the first fin structure so that an opening is formed in the insulating layer and the first semiconductor layer is exposed in a bottom portion of the opening, while protecting the upper portion of the second fin structure so as not to be etched;
    forming a third semiconductor layer on the exposed first semiconductor layer in the opening;
    forming a fourth semiconductor layer in the opening on the remaining layer of the third semiconductor layer;
    recessing the insulating layer so that at least a part of the fourth semiconductor layer and a part of the upper portion of the second fin structure are exposed from the insulating layer; and
    forming a first gate structure over the exposed fourth semiconductor layer and a second gate structure over the exposed portion of the second fin structure.

12. The method of claim 11, wherein:
    the first semiconductor layer includes $Si_{(1-x)}Ge_x$,
    the third semiconductor layer includes $Si_{(1-y)}Ge_y$, the fourth semiconductor layer includes Ge or a $Si_{(1-z)}Ge_z$, and y is smaller than x, and z is larger than y.

13. The method of claim 12, wherein:

x is in a range of 0.1 to 0.5, and y is equal to zero or less than 0.1.

14. The method of claim 13, wherein:

in the forming the third semiconductor layer on the first semiconductor layer, Si is formed as the third semiconductor layer, and after the forming a gate structure, the remaining layer of the third semiconductor layer contains Ge in an amount of less than 10 atm %.

15. The method of claim 11, wherein the forming a cover layer includes:

forming a blanket layer of a cover layer material over the first and second fin structures;

forming a sacrificial layer to cover bottom portions of the first and second fin structures with the blanket layer so that upper portions of the first and second fin structures with the blanket layer expose from the sacrificial layer; and removing the blanket layer on the upper portions of the first and second fin structures are exposed from the sacrificial layer.

16. The method of claim 11, wherein an upper end of the cover layer is 10 nm to 60 nm higher than an interface between the first semiconductor layer and the second semiconductor layer.

17. The method of claim 11, wherein the cover layer includes silicon nitride.

18. The method of claim 11, wherein the insulating layer is formed by CVD followed by annealing at a temperature less than 800° C.

19. A semiconductor device comprising a first fin field effect transistor (Fin FET), the first Fin FET including:

a first fin structure extending in a first direction and protruding from an isolation insulating layer, the first fin structure and the isolation insulating layer being disposed over a substrate, the first fin structure including a first layer made of a first semiconductor material, a second layer made of a second semiconductor material disposed over the first layer and a third layer made of a third semiconductor material disposed over the second layer; and a first gate stack including a gate electrode layer and a gate dielectric layer, covering a portion of the first fin structure and extending in a second direction perpendicular to the first direction, wherein:

an interface between the second layer and the third layer is located below an upper surface of the isolation insulating layer, the third layer functions as a channel region of the first Fin FET, the first semiconductor material includes $Si_{(1-x)}Ge_x$, the second semiconductor material includes $Si_{(1-y)}Ge_y$, the third semiconductor material includes Ge or a $Si_{(1-z)}Ge_z$, and y is smaller than x, z is larger than y, and a height of the channel region from a surface of the isolation region is greater than a thickness of the second layer.

20. The semiconductor device of claim 19, wherein the second semiconductor material contains Ge.

* * * * *